United States Patent
Wu et al.

(10) Patent No.: US 12,543,507 B2
(45) Date of Patent: Feb. 3, 2026

(54) SEMICONDUCTOR DEVICE AND METHOD OF FABRICATING THE SAME

(71) Applicant: United Microelectronics Corp., Hsinchu (TW)

(72) Inventors: Jia-Rong Wu, Kaohsiung (TW); Yi-An Shih, Changhua County (TW); Hsiu-Hao Hu, Keelung (TW); I-Fan Chang, Tainan (TW); Rai-Min Huang, Taipei (TW); Po Kai Hsu, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 370 days.

(21) Appl. No.: 18/329,588

(22) Filed: Jun. 6, 2023

(65) Prior Publication Data
US 2024/0365677 A1    Oct. 31, 2024

(30) Foreign Application Priority Data
Apr. 26, 2023    (TW) .................................. 112115517

(51) Int. Cl.
| | |
|---|---|
| *H01L 21/78* | (2006.01) |
| *H10B 61/00* | (2023.01) |
| *H10N 50/01* | (2023.01) |
| *H10N 50/20* | (2023.01) |
| *H10N 50/80* | (2023.01) |

(52) U.S. Cl.
CPC ............. *H10N 50/20* (2023.02); *H10B 61/22* (2023.02); *H10N 50/01* (2023.02); *H10N 50/80* (2023.02)

(58) Field of Classification Search
CPC ........ H10N 50/20; H10N 50/01; H10N 50/80; H10N 50/10; H10B 61/22
USPC ........................................................ 257/421
See application file for complete search history.

(56) References Cited

U.S. PATENT DOCUMENTS

| | | | | |
|---|---|---|---|---|
| 7,569,401 | B2 * | 8/2009 | Park .................... | H10N 50/10 257/295 |
| 8,063,459 | B2 * | 11/2011 | Ranjan ................ | B82Y 40/00 365/158 |
| 8,368,222 | B2 | 2/2013 | Okuyama | |
| 9,087,633 | B2 * | 7/2015 | Khvalkovskiy ....... | G11C 11/161 |
| 9,142,762 | B1 * | 9/2015 | Li ........................ | H10N 50/80 |
| 9,299,736 | B2 | 3/2016 | Chen et al. | |
| 9,437,572 | B2 | 9/2016 | Chen et al. | |

(Continued)

*Primary Examiner* — Vu A Vu
(74) *Attorney, Agent, or Firm* — JCIPRNET

(57) ABSTRACT

Provided is a semiconductor device including a substrate, a first interconnection structure, and an MTJ device. The first interconnection structure is disposed on the substrate. The MTJ device is reversely bonded to the first interconnection structure. The MTJ device includes a first electrode layer, a second electrode layer and an MTJ stack structure. The first electrode layer is bonded to the first interconnect structure. The second electrode layer is located above the first electrode layer. The MTJ stack structure is located between the first and second electrode layers. The MTJ stack structure includes a first barrier layer, a free layer and a reference layer. The first barrier layer is located between the first and second electrode layers. The free layer is located between the first barrier layer and the first electrode layer. The reference layer is located between the first barrier layer and the second electrode layer.

15 Claims, 16 Drawing Sheets

(56) References Cited

U.S. PATENT DOCUMENTS

| | | | |
|---|---|---|---|
| 10,340,261 B1 | 7/2019 | Sukekawa | |
| 10,636,744 B2 | 4/2020 | Wang et al. | |
| 10,707,412 B2 | 7/2020 | Weng et al. | |
| 10,797,224 B2* | 10/2020 | Raghavan | H10B 61/22 |
| 10,804,461 B1 | 10/2020 | Liu et al. | |
| 10,847,574 B2 | 11/2020 | Wang et al. | |
| 10,867,808 B1 | 12/2020 | Ke et al. | |
| 10,903,269 B2 | 1/2021 | Kuo et al. | |
| 11,043,630 B2* | 6/2021 | Aggarwal | H01L 21/3065 |
| 11,081,153 B2* | 8/2021 | Gupta | H10B 61/22 |
| 11,114,607 B2* | 9/2021 | Reznicek | H10N 50/80 |
| 11,404,630 B2* | 8/2022 | Rahman | H10N 50/80 |
| 11,538,817 B2 | 12/2022 | Makala et al. | |
| 11,818,962 B2* | 11/2023 | Chang | H10N 50/80 |
| 2021/0265295 A1 | 8/2021 | Liu et al. | |
| 2022/0158087 A1 | 5/2022 | Kuo | |
| 2023/0025541 A1 | 1/2023 | Hu et al. | |
| 2023/0189657 A1* | 6/2023 | Chuang | H10N 50/01 257/421 |
| 2024/0114702 A1* | 4/2024 | Chia | H10B 80/00 |
| 2024/0206345 A1* | 6/2024 | Dutta | H10N 50/10 |

* cited by examiner

SEMICONDUCTOR DEVICE AND METHOD OF FABRICATING THE SAME

CROSS-REFERENCE TO RELATED APPLICATION

This application claims the priority benefit of Taiwan application serial no. 112115517, filed on Apr. 26, 2023. The entirety of the above-mentioned patent application is hereby incorporated by reference herein and made a part of this specification.

BACKGROUND

Technical Field

The present disclosure relates to an integrated circuit and a method of fabricating the same, and particularly to a semiconductor device and a method of fabricating the same.

Description of Related Art

The magnetoresistance (MR) effect is the tendency of a material to change the value of its electrical resistance in an external magnetic field. The definition of its physical quantity is the resistance difference in the presence or absence of the magnetic field divided by the original resistance, which is used to represent the resistance change rate. At present, the magnetoresistance effect has been successfully used in the production of hard disks and has important commercial application value. In addition, magnetic random access memory (MRAM) may also be made by using the characteristics of giant magnetoresistive materials with different resistance values in different magnetization states, which has the advantage of retaining the stored data at power off.

The above-mentioned magnetoresistance effect is also applied in the field of magnetic field sensor, such as an electronic compass component equipped with a global positioning system (GPS) in a mobile phone, for providing information such as the moving position of a user. At present, there are various magnetic field sensor technologies on the market, such as anisotropic magnetoresistance (AMR) sensing devices, giant magnetoresistance (GMR) sensing devices, magnetic tunneling junction (MTJ) sensing devices, etc.

A standard magnetic tunnel junction device in the prior art occupies a small chip area, but exhibits the disadvantages of higher power consumption and smaller writing margin. Another reversed cell type magnetic tunnel junction device exhibits better writing margin and lower power consumption, but a bridge electrical connection is required for such device. The fabricating process is quite complicated, the cell size is large, and such device occupies a large chip area.

SUMMARY

An embodiment of the present disclosure provides a semiconductor device with an MTJ device. The MTJ device exhibits better writing margin and lower power consumption. Moreover, the fabricating process is simplified, the chip area occupied by a bridge connection is greatly reduced, and the cell size is reduced.

A semiconductor device according to an embodiment of the present disclosure includes a substrate, a first interconnect structure, and an MTJ device. The first interconnection structure is disposed on the substrate. The MTJ device is reversely bonded to the first interconnection structure. The MTJ device includes a first electrode layer, a second electrode layer and an MTJ stack structure. The first electrode layer is bonded to the first interconnect structure. The second electrode layer is located above the first electrode layer. The MTJ stack structure is located between the first electrode layer and the second electrode layers. The MTJ stack structure includes a first barrier layer, a free layer and a reference layer. The first barrier layer is located between the first electrode layer and the second electrode layer. The free layer is located between the first barrier layer and the first electrode layer. The reference layer is located between the first barrier layer and the second electrode layer.

A method of fabricating a semiconductor device according to an embodiment of the present disclosure includes the following steps. A first wafer is provided, wherein the first wafer comprises a first substrate and a first interconnect structure. A second wafer is provided, wherein a method of forming the second wafer includes the following steps. A second substrate is provided. A sacrificial layer is formed on a first surface of the second substrate. A second interconnect structure is formed on the sacrificial layer. An MTJ device is formed on the second interconnect structure. A protection layer is formed on a surface and a sidewall of the MTJ device. A dielectric layer is formed on the protection layer. The dielectric layer and the protection layer are planarized to expose the MTJ device. The second substrate is turned over to expose a second surface of the second substrate. A bonding process is performed to bond the second wafer to the first wafer. The second substrate is removed. The sacrificial layer is removed to expose the second interconnect structure.

Based on the above, the inverted cell type MTJ device of a semiconductor device of an embodiment of the present disclosure exhibits better writing margin and lower power consumption. Moreover, the inverted cell type MTJ device is electrically connected to the source/drain region of a metal oxide semiconductor device without a bridge electrical connection. Therefore, the fabricating process can be simplified, the chip area occupied by a bridge electrical connection can be greatly reduced, and the cell size can be accordingly reduced.

DESCRIPTION OF THE EMBODIMENTS

FIG. 1A to FIG. 1E are schematic cross-sectional views of a method of fabricating a part of a semiconductor device according to an embodiment of the present disclosure.

Figure 1A:
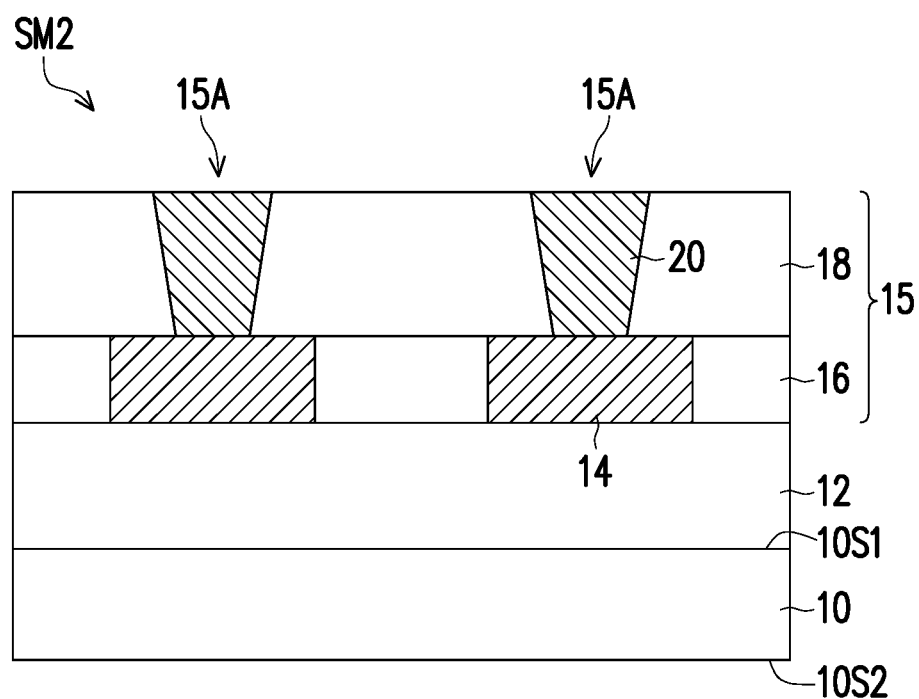
FIG. 1A to FIG. 1E are schematic cross-sectional views of a method of fabricating a wafer having a part of a semiconductor device according to an embodiment of the present disclosure.

Referring to FIG. 1A, a substrate 10 is provided. For example, the substrate 10 may be made of a semiconductor material, and the semiconductor material may be selected from the group consisting of silicon, germanium, silicon-germanium compound, silicon carbide, gallium arsenide, and the like. A sacrificial layer 12 is formed on a surface 10S1 of the substrate 10. The sacrificial layer 12 includes an insulating material such as silicon oxide, silicon nitride, silicon oxynitride or a combination thereof.

Next, an interconnect structure 15 is formed on the sacrificial layer 12. The interconnect structure 15 includes a dielectric layer 16, an interconnect layer 15A and an insulating layer 18. The dielectric layer 16 includes a dielectric material, such as silicon oxide. The interconnect layer 15A includes a conductive line 14 and a via 20. Each of the conductive line 14 and the via 20 may include a barrier layer (or adhesive layer) and a metal layer. The barrier layer (or adhesive layer) is located between the dielectric layer 16 and the metal layer or between the insulating layer 18 and the metal layer. The barrier layer may be selected from the group consisting of titanium (Ti), titanium nitride (TiN), tantalum (Ta) and tantalum nitride (TaN). The metal layer may be selected from the group consisting of tungsten (W), copper (Cu), aluminum (Al), titanium aluminum alloy (TiAl), cobalt tungsten phosphide (CoWP) and the like, but the disclosure not limited thereto.

The conductive line 14 and the dielectric layer 16 may be formed by a single damascene process. For example, after the dielectric layer 16 is formed, a trench (not shown) is formed in the dielectric layer 16, and a barrier layer and a metal layer are then formed on the dielectric layer 16 and in the trench. Afterwards, a chemical mechanical planarization process or an etching back process is performed, so as to remove the excess barrier layer and metal layer and therefore form the conductive line 14 in the trench.

The conductive line 14 and dielectric layer 16 may also be formed by a typical patterning process. For example, a barrier layer and a metal layer is formed on the sacrificial layer 12. Then, lithography and etching processes are performed to pattern the barrier layer and the metal layer to form the conductive line 14. Afterwards, a dielectric material is formed on the sacrificial layer 12 and the conductive line 14. A chemical mechanical planarization process or an etching back process is then performed, so as to remove the excess dielectric material on the conductive line 14 and therefore form the dielectric layer 16.

Figure 1B:
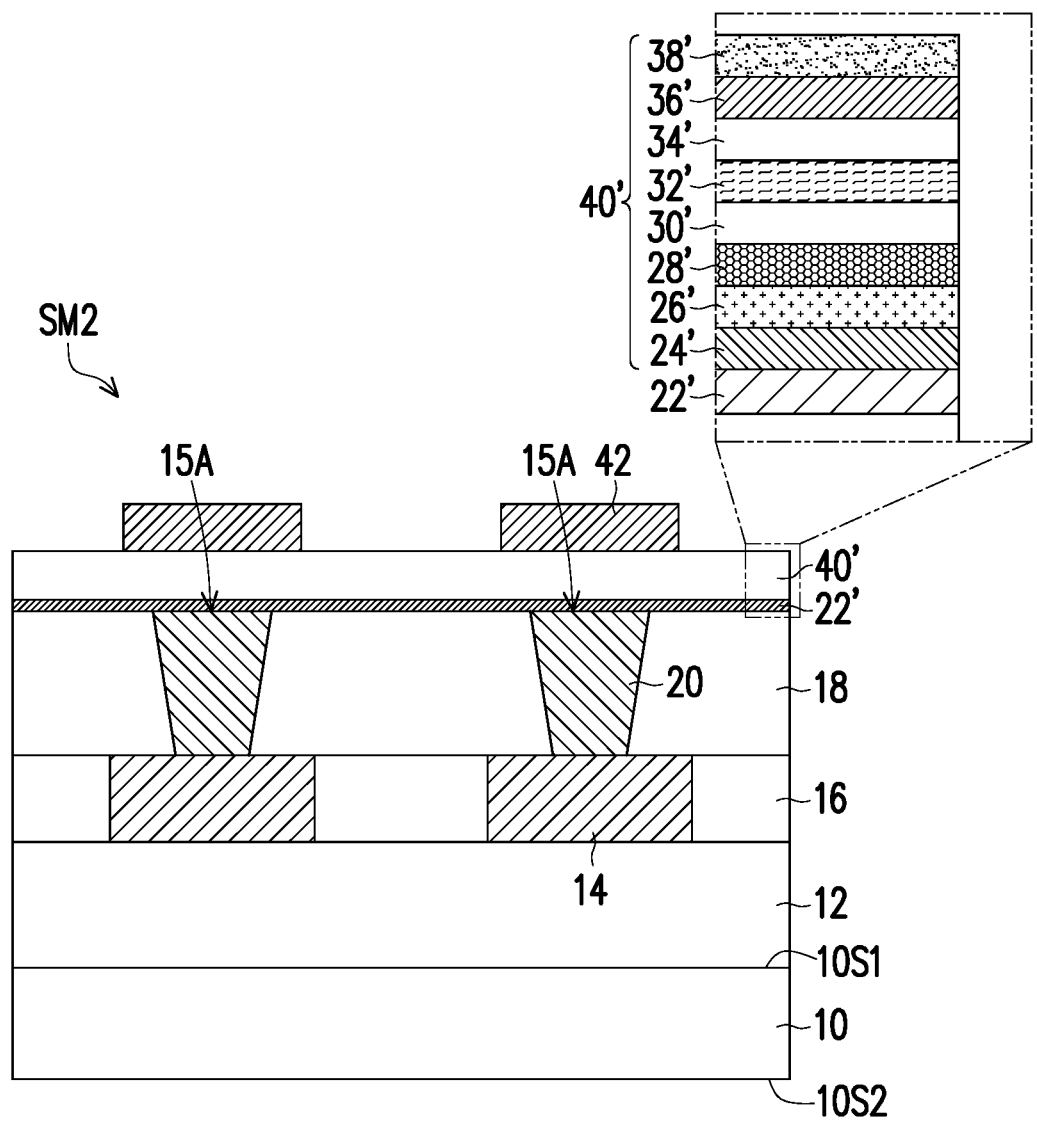

Referring to FIG. 1B, the insulating layer 18 is formed on the dielectric layer 16 and the conductive line 14. The insulating layer 18 includes silicon oxide, such as silicon oxide formed by using tetraethylsiloxane (TEOS) as a reaction gas. The via 20 is formed in the insulating layer 18. A via opening (not shown) is formed in the insulating layer 18. Next, a barrier layer and a metal layer are formed on and in the insulating layer 18. A chemical mechanical planarization process or an etching back process is performed, so as to remove the excess barrier layer and metal layer on the insulating layer 18 and therefore form the via 20.

Referring to FIG. 1B, an electrode layer 22' is then formed on the substrate 10. The electrode layer 22' is electrically connected to the via 20 of the interconnect layer 15A. In some embodiments, the material of the electrode layer 22' includes a conductive material such as titanium (Ti), tantalum (Ta), platinum (Pt), copper (Cu), gold (Au), aluminum (Al), titanium nitride (TiN) or a combination thereof, but the disclosure is not limited thereto.

Afterwards, an MTJ stack layer 40' is formed on the electrode layer 22'. In some embodiments, the MTJ stack layer 40' includes a seed layer 24', a pinned layer 26', a reference layer 28', a barrier layer 30', a free layer 32', a barrier layer 34', a stop layer 36' and a hard mask layer 38'. The seed layer 24' is a ferromagnetic material such as iron, cobalt, nickel or alloys thereof. A pinned layer 26' is located on the seed layer 24'. The material of the pinned layer 26' may include an antiferromagnetic (AFM) material, such as iron manganese (FeMn), platinum manganese (PtMn), iridium manganese (IrMn), nickel oxide (NiO), etc., so as to fix or confine the magnetic moment direction of adjacent layers. The reference layer 28' is formed between the pinned layer 26' and the barrier layer 30', and its material includes a ferromagnetic material, such as iron, cobalt, nickel or alloys thereof, such as cobalt-iron-boron (CoFeB), but the disclosure is not limited thereto. The material of the barrier layer 30' may include an oxide insulating material, such as aluminum oxide ($AlO_x$) or magnesium oxide (MgO), but the disclosure is not limited thereto. The free layer 32' is formed between the barrier layers 30' and 34'. The magnetization direction of the free layer 32' is "free" to be changed by an external magnetic field. The material of the free layer 32 includes a ferromagnetic material, such as iron, cobalt, nickel or an alloy thereof such as cobalt-iron-boron (CoFeB), but the disclosure is not limited thereto. The free layer 32 may be a single layer or have a multi-layer structure. The stop layer 36' is formed on the barrier layer 34'. The stop layer 36' (such as Ru) may serve as an etching stop layer in the subsequent patterning process. The hard mask layer 38' may include tantalum nitride or titanium nitride. The barrier layer 30' is formed on the sequentially stacked layers of the seed layer 24', the pinned layer 26' and the reference layer 28', so the surface of the barrier layer 30' has relatively high flatness. The free layer 32' is formed on the barrier layer 30' with high flatness, so the free layer 32' exhibits good magnetic properties.

An electrode layer 42 is formed on the MTJ stack structure 40. The material of the electrode layer 42 includes a conductive material such as titanium (Ti), tantalum (Ta), platinum (Pt), copper (Cu), gold (Au), aluminum (Al), titanium nitride (TiN) or a combination thereof, but the disclosure is not limited thereto. In some embodiments, the electrode layer 22' includes a titanium/titanium nitride composite layer, and the electrode layer 42 includes titanium nitride. The method of forming the electrode layer 42 may include forming an electrode material (not shown) on the MTJ stack layer 40'. Then, lithography and etching processes are performed to pattern the electrode material. In the patterning process, a hard mask layer (such as silicon oxide or silicon nitride) is first formed on the electrode material, and then patterned by lithography and etching processes. Next, the electrode material is patterned by using the patterned hard mask layer as an etching mask, so as to form the electrode layer 42. Afterwards, the patterned hard mask layer is removed.

Figure 1C:
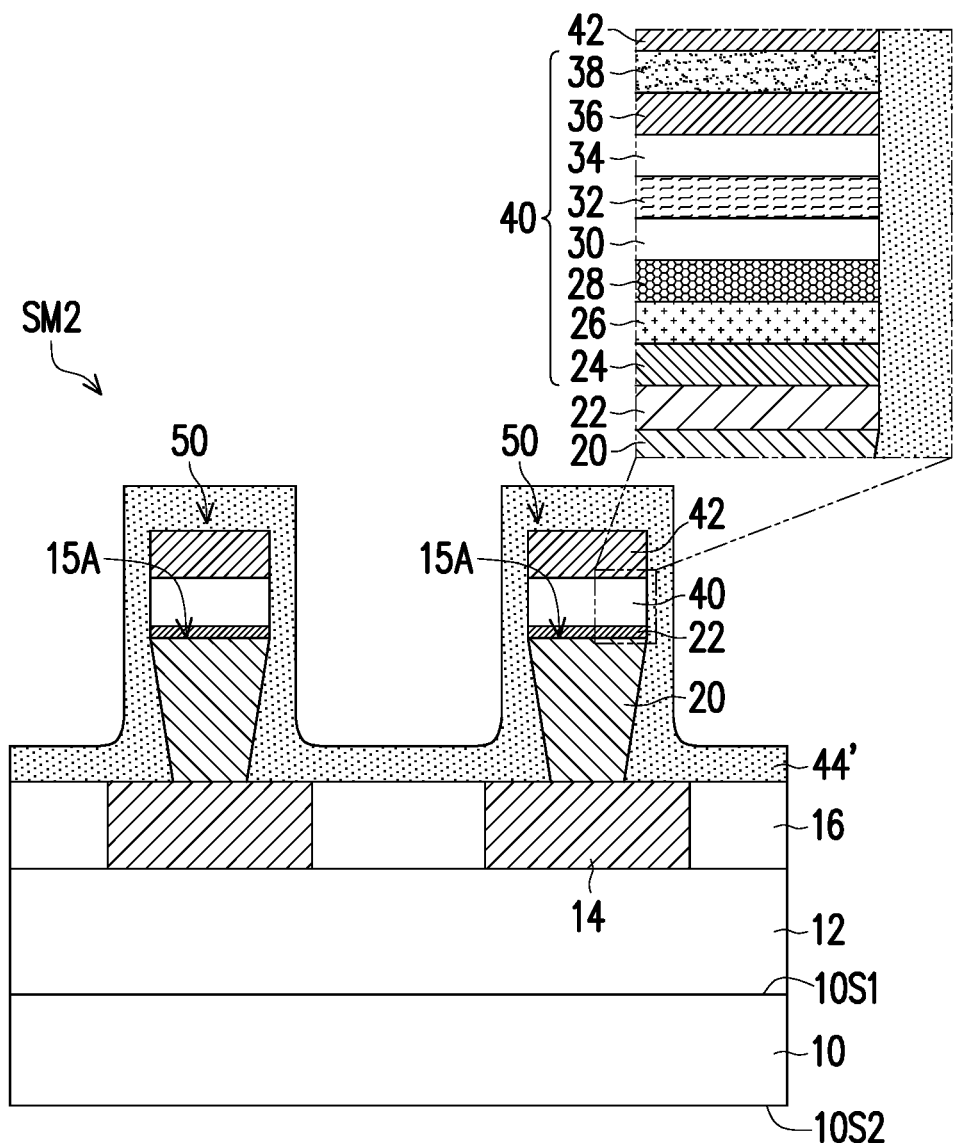

Referring to FIG. 1C, an etching process is performed by using the electrode layer 42 as a mask, so as to pattern the MTJ stack layer 40' and the electrode layer 22' to form multiple MTJ stack structures 40 and multiple electrode layers 22. During the etching process, the electrode layer 42 may be partially etched, and the insulating layer 18 may be completely etched away, or partially etched with some left (not shown). An electrode layer 42, an MTJ stack structure 40 and an electrode layer 22 form an MTJ device 50. The MTJ stack structure 40 includes a seed layer 24, a pinned layer 26, a reference layer 28, a barrier layer 30, a free layer 32, a barrier layer 34, a stop layer 36 and a hard mask layer 38.

Referring to FIG. 1C, a protection layer 44' is formed over the substrate 10. In some embodiments, the protection layer 44' covers the surface and the sidewall of the electrode layer 42, the sidewall of the MTJ stack structure 40, the sidewall of the electrode layer 22, the sidewall of the via 20, the surfaces of the conductive line 14 and the dielectric layer 16. The material of the protection layer 44' includes a dielectric material such as silicon nitride, silicon oxide, silicon oxynitride, SiCON, SiC or a combination thereof. The method of forming the protection layer 44' includes chemical vapor deposition (CVD) or atomic layer deposition (ALD). The protection layer 44' may be a single layer or have a multi-layer structure.

Figure 1D:
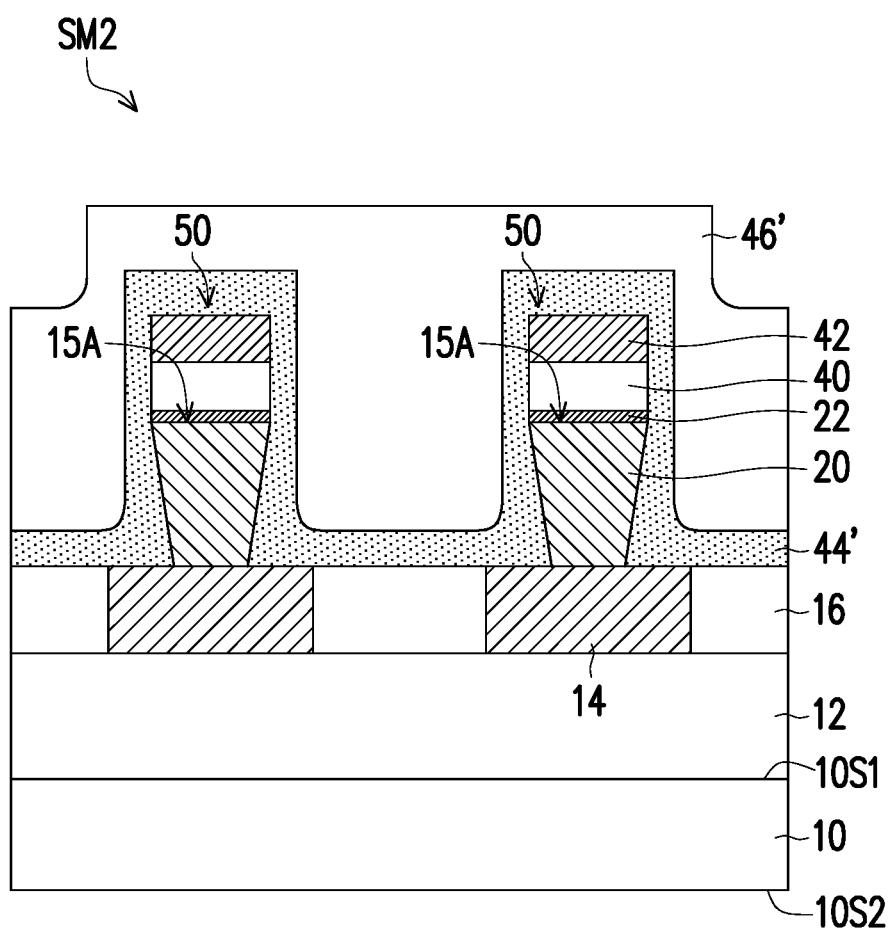

Referring to FIG. 1D, a dielectric layer 46' is formed on the protection layer 44'. The material of the dielectric layer 46' may include phosphosilicate glass, borophosphosilicate glass, a low dielectric constant material, an ultra-low dielectric constant material or a combination thereof. The method of forming the dielectric layer 46' may include spin coating, chemical vapor deposition, atomic layer deposition (ALD) or a combination thereof.

Figure 1E:
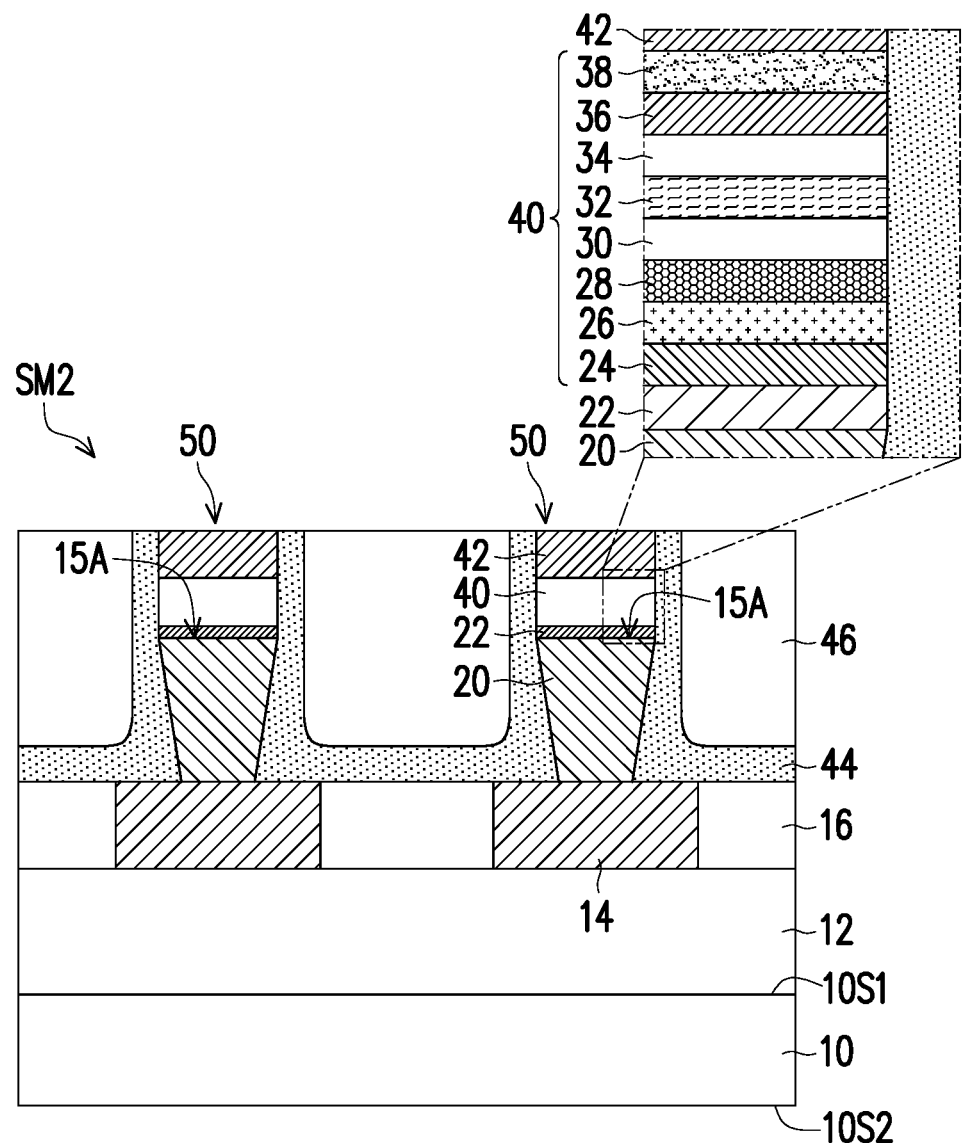

Referring to FIG. 1E, a planarization process (such as a chemical mechanical polishing process or an etching back process) is performed to the dielectric layer 46' and the protection layer 44', so as to form a dielectric layer 46 and a protection layer 44.

The fabrication of a wafer SM2 is thus completed. The wafer SM2 has a part of a semiconductor device. The wafer SM2 includes a substrate 10, a sacrificial layer 12, a dielectric layer 16, a dielectric layer 46, a protection layer 44, an interconnect layer 15A, and multiple MTJ devices 50. Each MTJ device 50 is electrically connected to the interconnect layer 15A.

Figure 2:
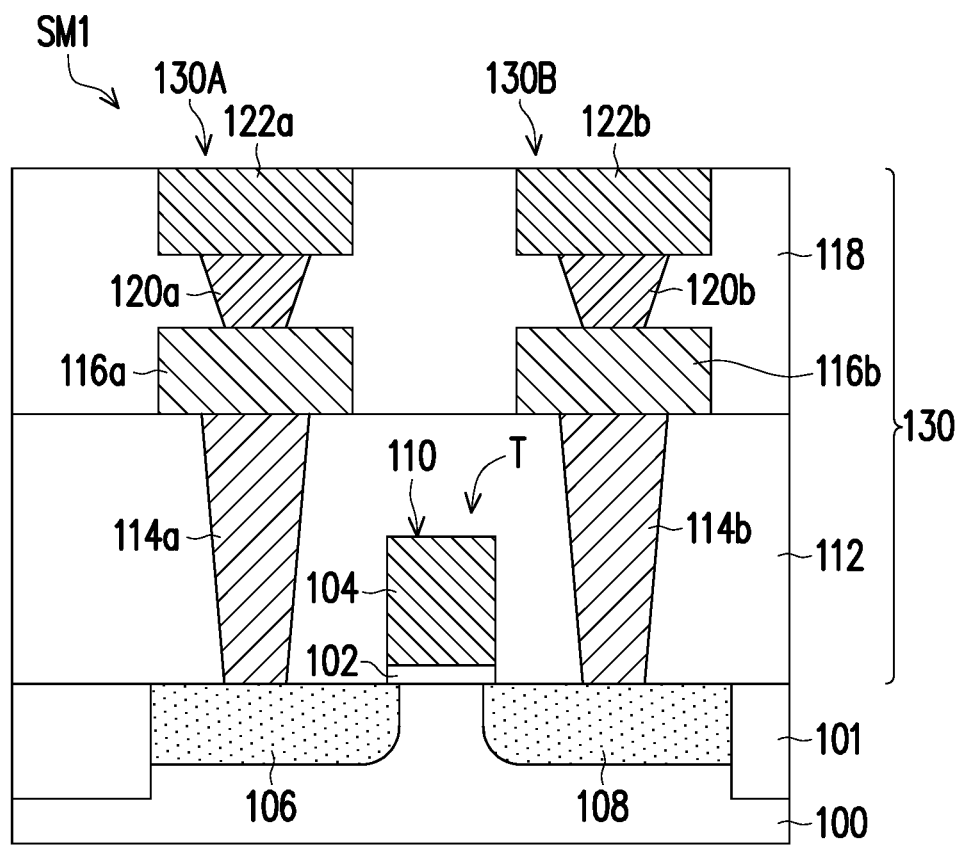
FIG. 2 is a schematic cross-sectional view of a wafer having another part of the semiconductor device according to an embodiment of the present disclosure.

FIG. 2 is a schematic cross-sectional view of another wafer.

Referring to FIG. 2, a wafer SM1 includes a substrate 100, an isolation structure 101, a metal oxide semiconductor device T and an interconnect structure 130. The substrate 100 may be a substrate 100 made of a semiconductor material, and the semiconductor material may be selected from the group consisting of silicon, germanium, silicon-germanium compound, silicon carbide, gallium arsenide, and the like. The metal oxide semiconductor device T, the isolation structure 101 and the interconnect structure 130 may be formed according to the following steps.

An isolation structure 101 is formed in the substrate 100 to define an active area in the substrate 100. The isolation structure 101 may be a shallow trench isolation structure. The material of the isolation structure 101 may include silicon oxide, silicon nitride or a combination thereof.

Next, a metal oxide semiconductor device T is formed on the substrate 100 in the active region. The metal oxide semiconductor device T may include an active device such as a metal oxide semiconductor (MOS) transistor. For example, the substrate 100 may include a MOS device T such as a planar MOS transistor or a non-planar MOS transistor (such as fin structure transistor). The MOS transistor may include a gate structure 110 and source/drain regions 106, 108. The gate structure 110 may include a gate dielectric layer 102 and a gate conductive layer 104. The gate dielectric layer 102 may include silicon oxide, silicon nitride, a high-k dielectric material or a combination thereof. The gate conductive layer 104 (such as doped polysilicon) is located on the gate dielectric layer 102. The source/drain regions 106, 108 may have a first conductivity type dopant or a second conductivity type dopant. The first conductivity type dopant may be an N-type dopant, such as phosphorus or arsenic. The second conductivity type dopant may be a P-type dopant, such as boron or boron trifluoride. The related process of fabricating the MOS device T such as a planar or non-planar MOS transistor is well known in the art, so the details are not further described herein.

Then, an interconnect structure 130 is formed on the substrate 100. The interconnect structure 130 may include an interlayer dielectric layer 112, an interlayer dielectric layer 118, interconnect layers 130A and 130B. The interconnect layers 130A/130B includes contacts 114a/114b, conductive lines 116a/116b, vias 120a/120b and conductive lines 122a/122b. Multiple contacts 114a, 114b are formed in the interlayer dielectric layer 112, and electrically connected to the source/drain regions 106, 108, respectively. Other contacts (not shown) may be formed in the interlayer dielectric layer 112 and electrically connect the gate conductive layer 104 of the MOS transistor. The conductive lines 116a, 116b, the vias 120a, 120b and the conductive lines 122a, 122b are formed in the interlayer dielectric layer 118. The conductive line 122a is electrically connected to the source/drain region 106 through the via 120a, the conductive line 116a and the contact 114a. The conductive line 122b is electrically connected to the source/drain region 108 through the via 120b, the conductive line 116b and the contact 114b. The conductive lines 122a and 122b may also be conductive blocks.

Each of the interlayer dielectric layer 112 and the interlayer dielectric layer 118 may include a dielectric material such as silicon oxide, a low dielectric constant material, an ultra-low dielectric constant material or a combination thereof. In some embodiments, an etching stop layer (not shown) may also be included between the interlayer dielectric layer 112 and the interlayer dielectric layer 118. The material of the etching stop layer includes silicon nitride, silicon oxynitride or a combination thereof.

In this embodiment, the contacts 114a, 114b, the conductive lines 116a, 116b, the vias 120a, 120b, and the conductive lines 122a, 122b of the interconnect structure 130 may be formed by single damascene processes or dual damascene processes. Each of the contacts 114a, 114b, the conductive lines 116a, 116b, the vias 120a, 120b, and the conductive lines 122a, 122b may include a barrier layer (or adhesive layer) and a metal layer. The barrier layer (or adhesive layer) is between the interlayer dielectric layer 112 and the metal layer, or between the interlayer dielectric layer 118 and the metal layer. The barrier layer may be selected from the group consisting of titanium (Ti), titanium nitride (TiN), tantalum (Ta) and tantalum nitride (TaN). The metal layer may be selected from the group consisting of tungsten (W), copper (Cu), aluminum (Al), titanium aluminum alloy (TiAl), cobalt tungsten phosphide (CoWP), but the disclosure is not limited thereto. The single damascene processes or dual damascene processes are a well-known technology in the art, so the details are not further described herein.

After the single damascene processes or the dual damascene processes, the interlayer dielectric layer 118 and the conductive lines 122a, 122b have a flat surface. In some embodiments, the interlayer dielectric layer 118 is coplanar with the conductive lines 122a, 122b.

The fabrication of a wafer SM1 is thus completed. The wafer SM1 has another part of the semiconductor device. The wafer SM1 includes a metal oxide semiconductor device T and an interconnect structure 130. The source/drain region 106 of the metal oxide semiconductor device T is electrically connected to the interconnect layer 130A of the interconnect structure 130, and the source/drain region 108 of the metal oxide semiconductor device T is electrically connected to the interconnect layer 130B of the interconnect structure 130.

FIG. 3A to FIG. 3D are schematic cross-sectional views of a method of fabricating a semiconductor device according to an embodiment of the present disclosure.

Figure 3A:
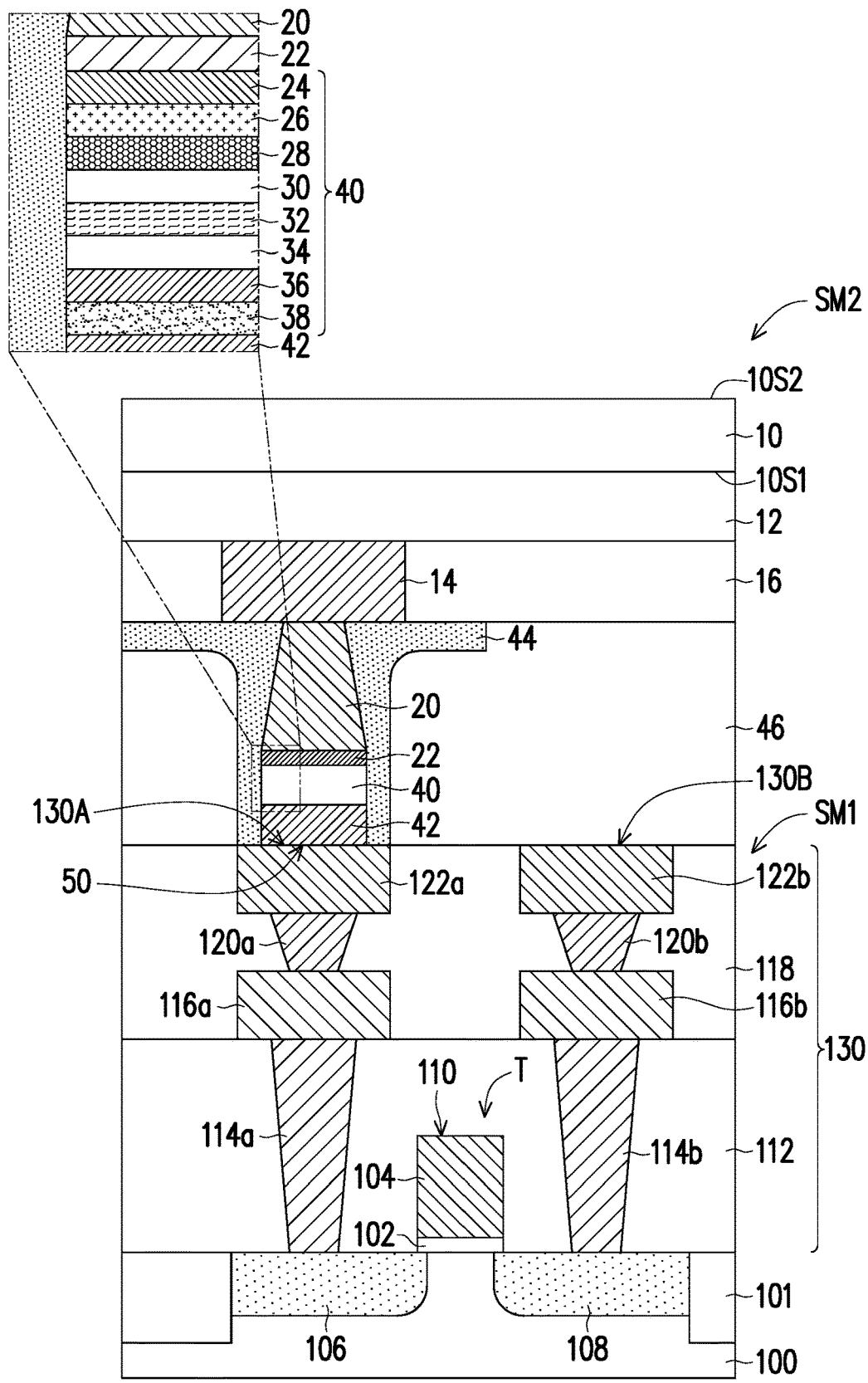
FIG. 3A to FIG. 3D are schematic cross-sectional views of a method of fabricating a semiconductor device according to an embodiment of the present disclosure.

Referring to FIG. 3A, the wafer SM2 is flipped or turned over. The MTJ device 50 is reversed due to the flipping of the wafer SM2. That is, the reference layer 28 of the MTJ device 50 is located on the barrier layer 30, and the barrier layer 30 is located on the free layer 32. Next, the wafer SM2 is bonded to the wafer SM1. The wafer SM2 and the wafer SM1 may be bonded through a hybrid bonding. The hybrid bonding includes a dielectric-to-dielectric bonding and a metal-to-metal bonding. In this embodiment, the dielectric layer 46 of the wafer SM2 may be bonded to the interlayer dielectric layer 118 of the interconnect structure 130 of the wafer SM1. The electrode layer 42 of the MTJ device 50 of the wafer SM2 may be bonded to the conductive line 122*a* of the interconnect structure 130 of the wafer SM1. The hybrid bonding may be performed by thermal annealing.

Figure 3B:
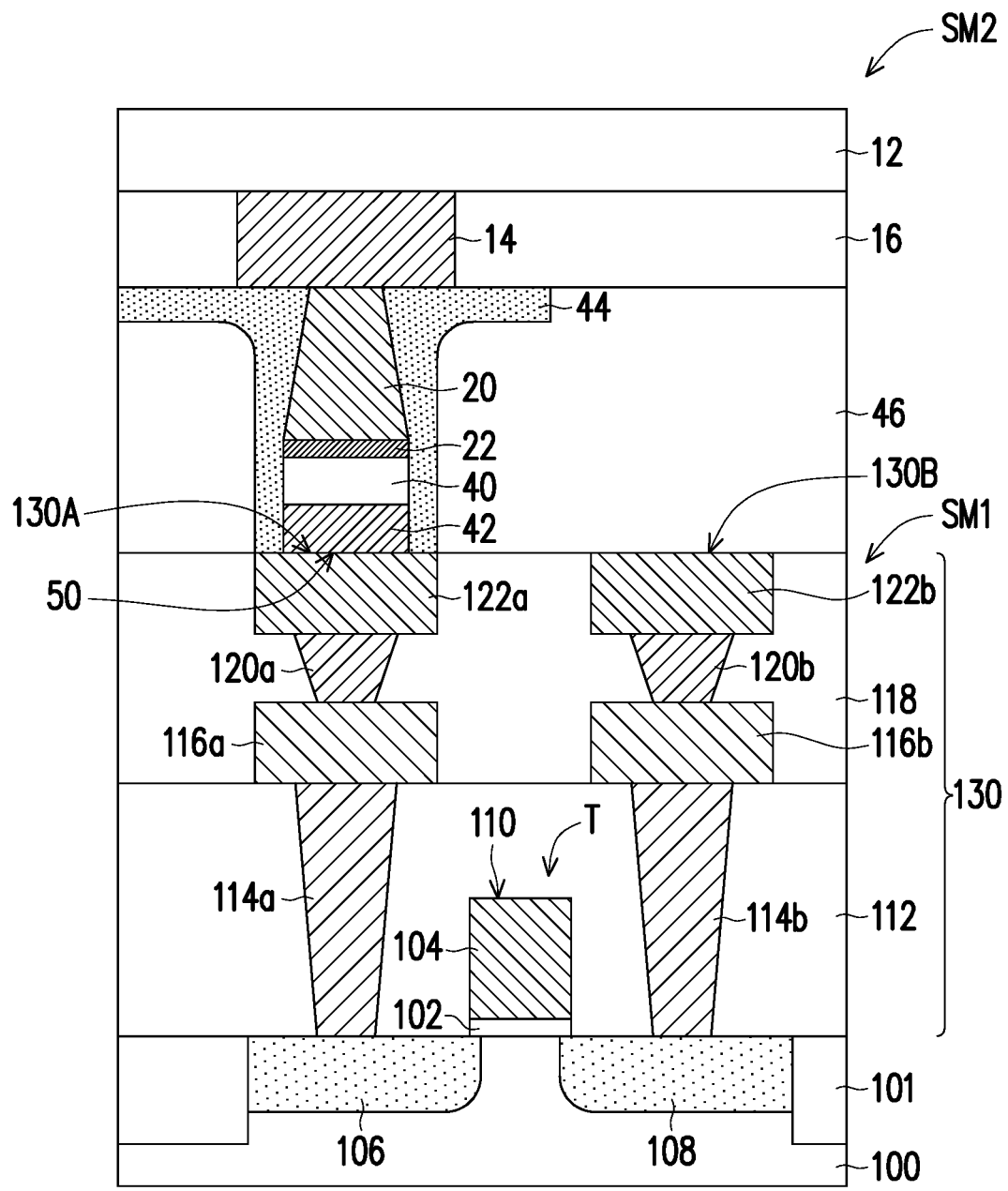

Referring to FIG. 3A and FIG. 3B, the substrate 10 is removed to expose the sacrificial layer 12. The method of removing the substrate 10 may include performing a grinding process to a surface 10S2 of the substrate 10.

Figure 3C:
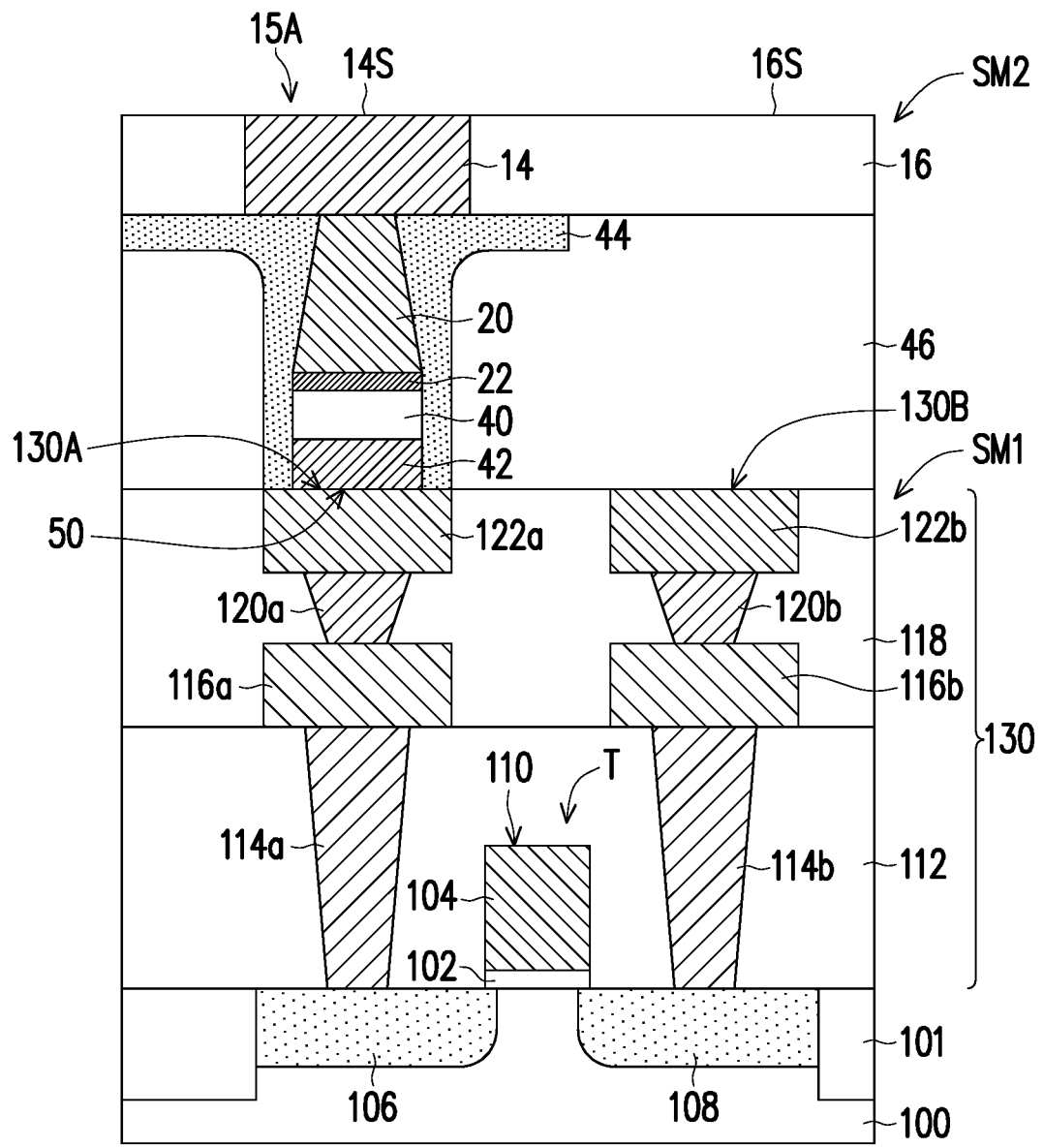

Referring to FIG. 3B and FIG. 3C, the sacrificial layer 12 is removed, so as to expose a surface 16S of the dielectric layer 16 and a surface 14S of the conductive line 14. The method of removing the sacrificial layer 12 may include a polishing process or an etching back process.

Figure 3D:
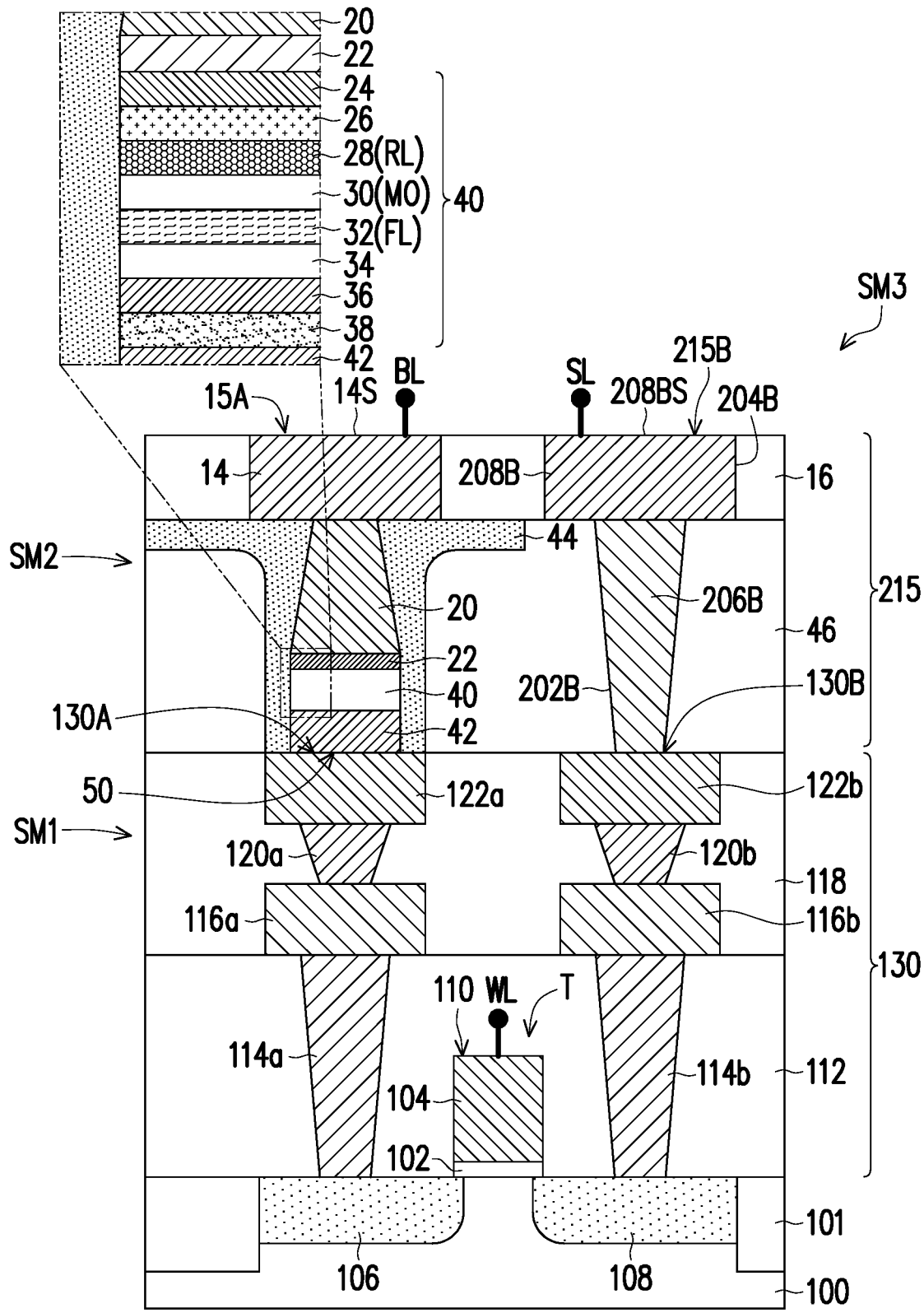

Referring to FIG. 3D, an interconnect layer 215B is formed in the dielectric layers 16 and 46. An interconnect layer 215B, an interconnect layer 15A and the dielectric layers 16 and 46 form the interconnect structure 215 together. The interconnect layer 215B may include a via 206B and a conductive line 208B. The via 206B and the conductive line 208B may be formed by a dual damascene process. For example, an via opening 202B may be formed in the dielectric layer 46 and a trench 204B may be formed in the dielectric layer 16 by lithography and etching processes. After that, a barrier layer and a metal layer are formed on the dielectric layer 16 and in the via opening 202B and the trench 204B. Thereafter, a planarization process is performed, so as to remove the excess barrier layer and metal layer on the dielectric layer 16 and therefore form the via 206B and conductive line 208B in the via opening 202B and the trench 204B. In some embodiments, the surface 16S of the dielectric layer 16, the surface 14S of the conductive line 14, and the surface 208BS of the conductive line 208B are coplanar.

Accordingly, the wafer SM2 is bonded to the wafer SM1, and the surface 16S of the dielectric layer 16, the surface 14S of the conductive line 14, and the surface 208BS of the conductive line 208B are exposed. Afterwards, the conductive line 14 may be connected to a bit line BL and the conductive line 208B may be connected to a source line SL through a back-end process, and a dicing process may be then performed for singulation to complete the fabrication of a semiconductor device SM3.

In semiconductor device SM3, the sizes of the upper portions of the vias 120*a*, 120*b*, the contacts 114*a*, 114*b*, and the via 206B are greater than the sizes of the corresponding lower portions of the vias 120*a*, 120*b*, the contacts 114*a*, 114, and the via 206B. The size of the upper portion of the via 20 is smaller than the size of the lower portion of the via 20.

Referring to FIG. 3D, in an embodiment of the present disclosure, the MTJ device 50 includes an electrode layer 22, an MTJ stack structure 40 and an electrode layer 42. The electrode layer 42 may be called an upper electrode layer or a first electrode layer. The electrode layer 22 may be called a lower electrode layer or a second electrode layer. Since the MTJ device 50 is arranged in reverse, the electrode layer serving as an upper electrode layer 42 is below the electrode layer 22 serving as a lower electrode layer. Furthermore, the MTJ stack structure 40 includes, from top to bottom, a seed layer 24, a pinned layer 26, a reference layer 28, a barrier layer 30, a free layer 32, a barrier layer 34, a stop layer 36 and a hard mask layer 38. The reference layer (RL) 28 is located on the barrier layer (MO) 30, and the barrier layer (MO) 30 is located on the free layer (FL) 32. The reference layer (RL) 28 is closer to the bit line BL than the free layer (FL) 32, and therefore, this type of reversely arranged MTJ device 50 is called a reversed cell type MTJ device or a reversed MTJ device.

Figure 6:
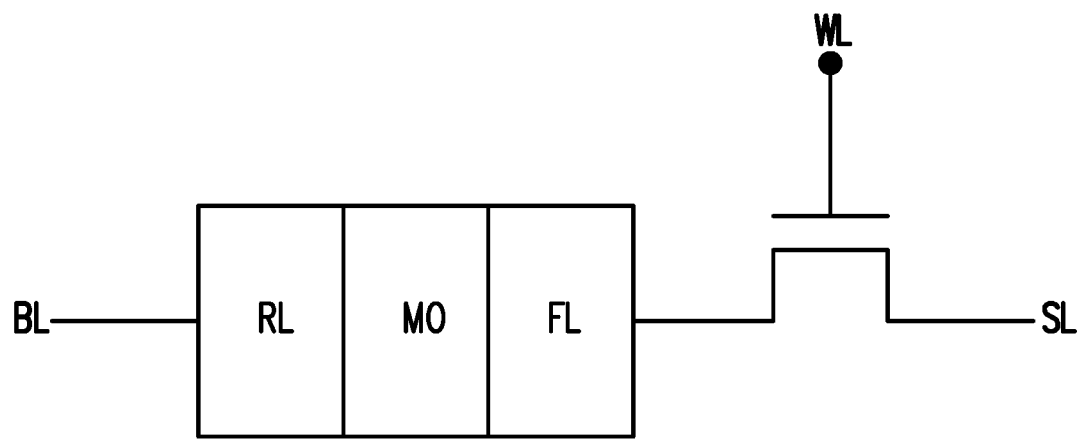
FIG. 6 is a schematic circuit diagram of a semiconductor device according to an embodiment of the present disclosure.

FIG. 6 is a schematic circuit diagram of a semiconductor device according to an embodiment of the present disclosure.

Referring to FIG. 3D and FIG. 6, in an embodiment of the present disclosure, a bit line BL is electrically connected to the electrode layer 22 of the reversed MTJ device 50 through the interconnect layer 15A. The electrode layer 42 of the reversed MTJ device 50 is electrically connected to the source/drain region 106 of the metal oxide semiconductor device T through the interconnect layer 130A of the interconnect structure 130. A source line SL is electrically connected to the source/drain region 108 of the metal oxide semiconductor device T through the interconnect layer 215B of the interconnect structure 215 and the interconnect layer 130B of the interconnect structure 130. The gate conductive layer 104 of the metal oxide semiconductor device T may serve as a word line WL or may be connected to a word line WL.

Referring to FIG. 3D and FIG. 6, since the MTJ device 50 of the semiconductor device SM3 of an embodiment of the present disclosure is a reversed cell type MTJ device, the reference layer (RL) 28 is closer to the bit line BL than the free layer (FL) 32, and therefore, such device exhibits better writing margin and lower power consumption. In addition, in an embodiment of the present disclosure, the reversed MTJ device 50 is connected to the source/drain region 106 of the metal oxide semiconductor device T through a bonding method, without the need of a bridge electrical connection. Accordingly, the fabricating process is simplified, the chip area occupied by a bridge connection is greatly reduced, and the cell size is reduced.

In the above embodiments, the interconnect layer 215B connecting the source line SL is formed after the bonding process is performed. However, the embodiment of the present disclosure is not limited thereto. In other embodiments, the interconnect layer 215A connecting the source line SL may also be formed in the wafer SM2' before the bonding process, as shown in FIG. 4B.

Figure 4A:
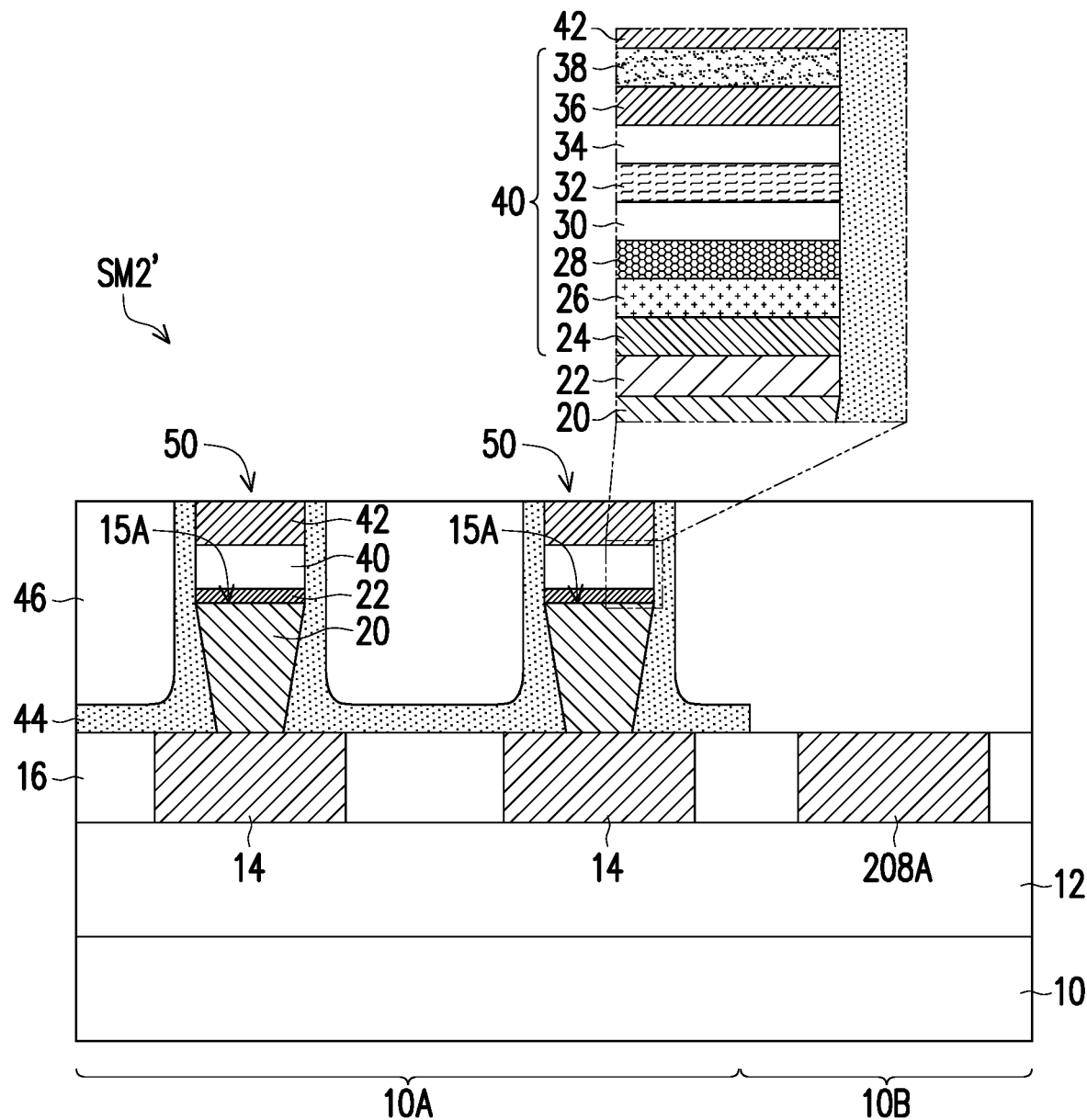
FIG. 4A to FIG. 4B are schematic cross-sectional views of a method of fabricating a wafer having a part of a semiconductor device according to another embodiment of the present disclosure.
Figure 4B:
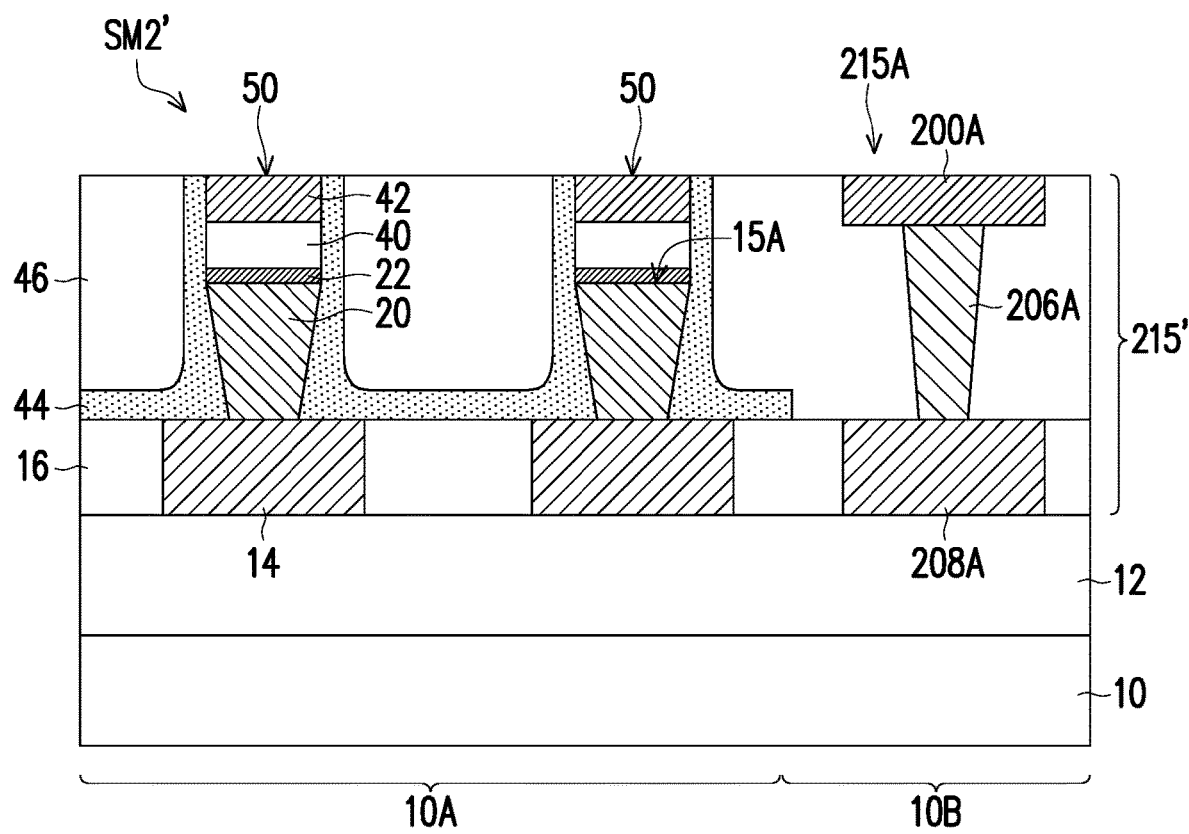

FIG. 4A to FIG. 4B are schematic cross-sectional views of a method of fabricating a wafer having a part of a semiconductor device according to another embodiment of the present disclosure.

Referring to FIG. 4A, a sacrificial layer 12, dielectric layers 16, 46, an interconnect layer 15A and multiple MTJ devices 50 of a wafer SM2' are formed according the methods of forming the sacrificial layer 12, the dielectric layers 16, 46, the interconnect layer 15A and the multiple MTJ devices 50 of the wafer SM2. The wafer SM2' further includes a conductive line 208A formed in the dielectric layer 16 when the conductive line 14 is formed. The conductive line 14 is formed in the memory array region 10A of the substrate 10, and the conductive line 208A is formed in the logic circuit region 10B of the substrate 10.

Referring to FIG. 4B, after forming the MTJ devices 50, the protection layer 44 and the dielectric layer 46, a via 206A and a conductive line 200A are formed in the dielectric layer 46. The conductive line 200A may also be a conductive block. The via 206A and the conductive line 200A may be formed by a dual damascene process. The conductive line 208A, the via 206A and the conductive line 200A form an interconnect layer 215A. The interconnect layer 215A, the interconnect layer 15A and the dielectric layers 46 and 16 form an interconnect structure 215'.

Figure 5A:
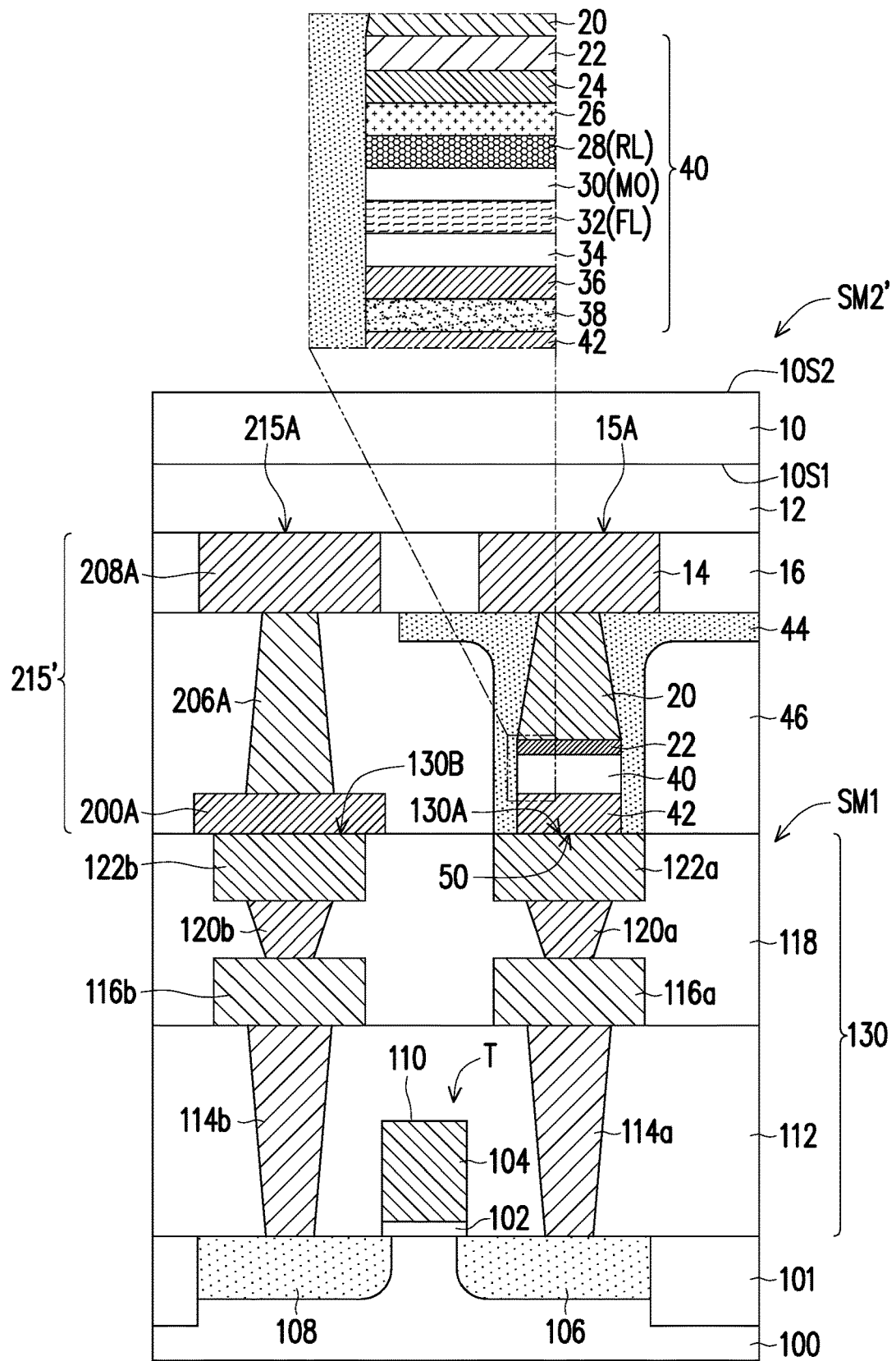
FIG. 5A to FIG. 5C are schematic cross-sectional views of a method of fabricating a semiconductor device according to another embodiment of the present disclosure.
Figure 5B:
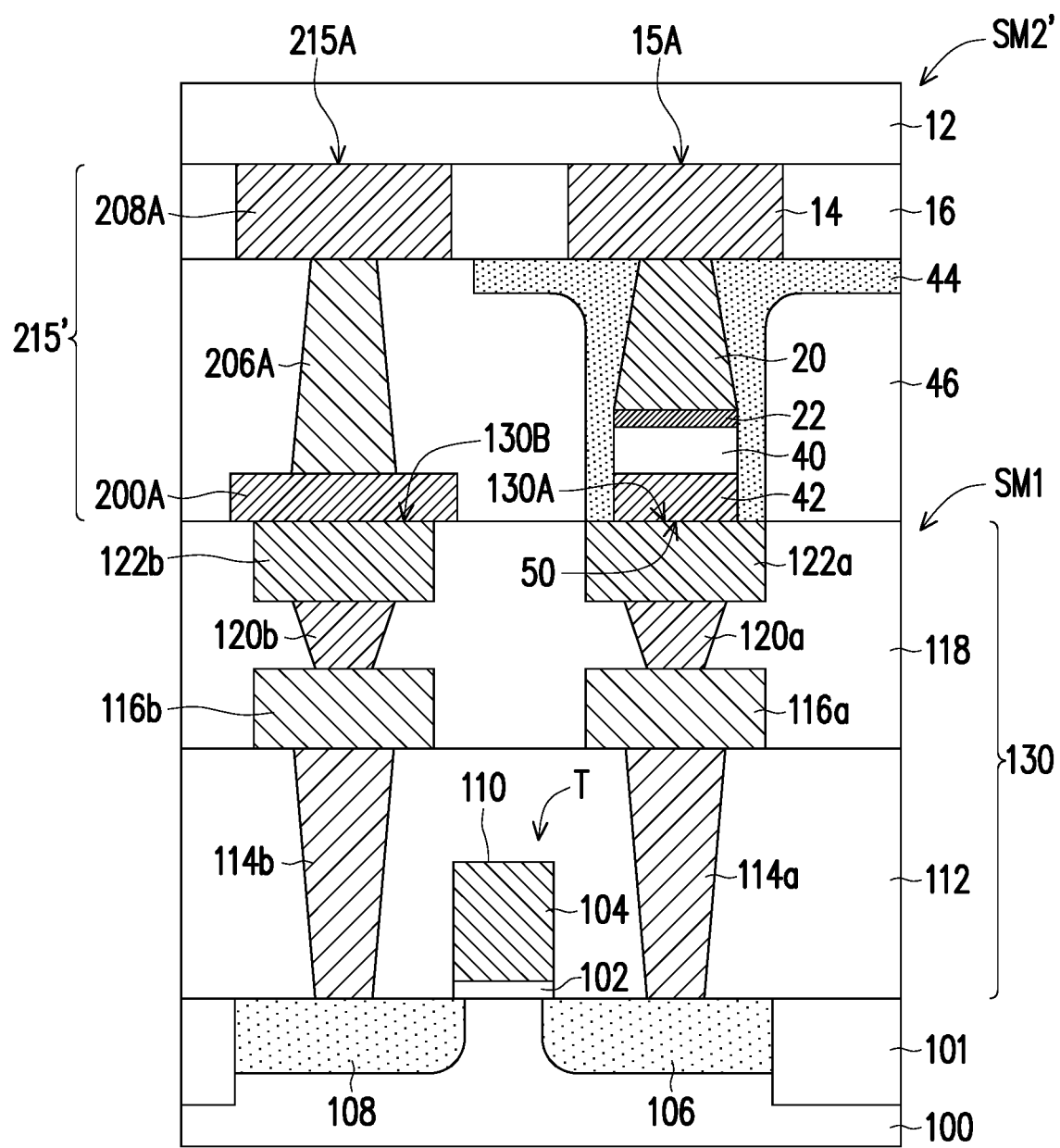
Figure 5C:
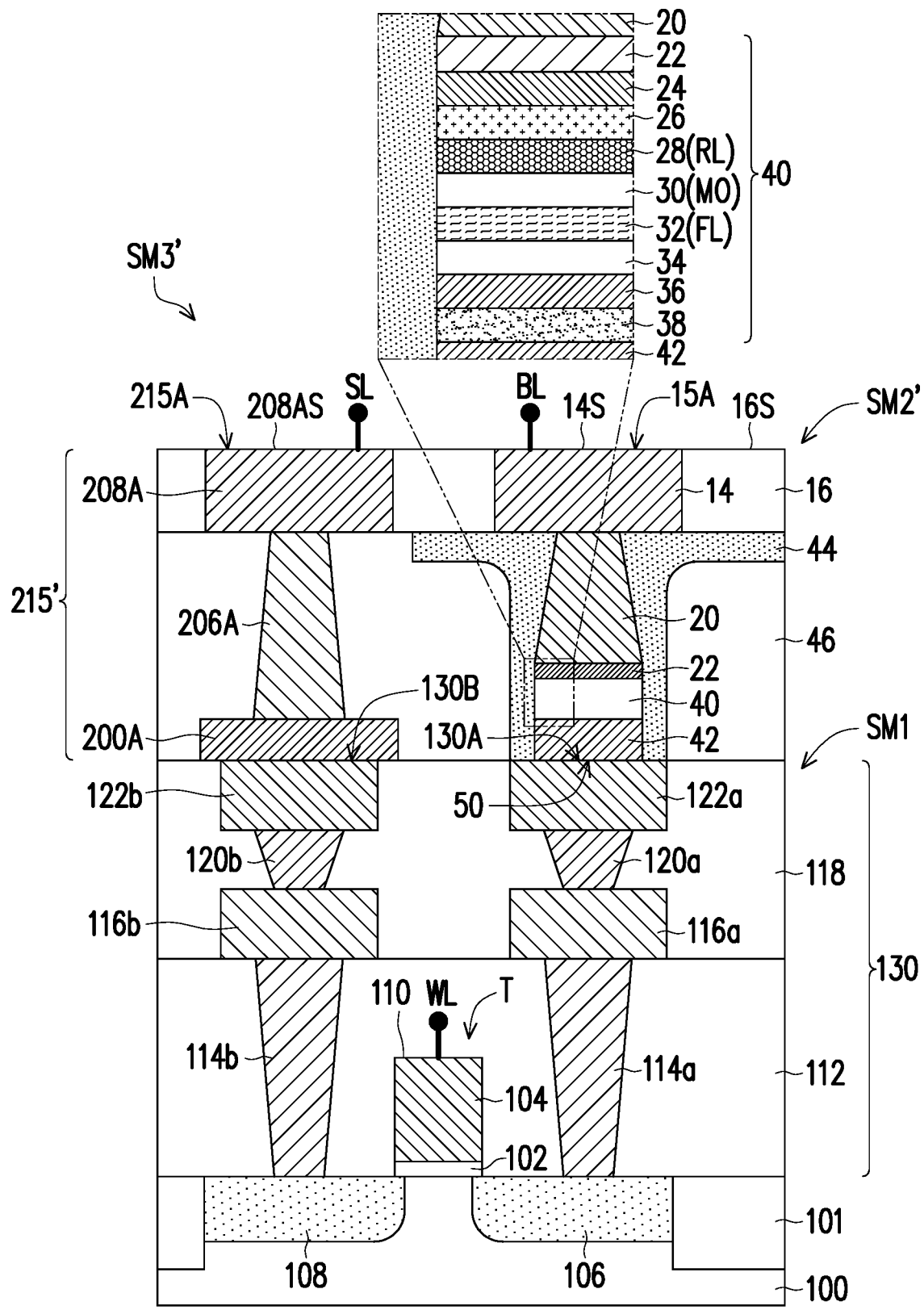

FIG. 5A to FIG. 5C are schematic cross-sectional views of a method of fabricating a semiconductor device according to another embodiment of the present disclosure.

Referring to FIG. 5A, the wafer SM2' is flipped or turned over. The MTJ device 50 is reversed due to the flipping of the wafer SM2'. That is, the reference layer (RL) 28 is located on the barrier layer 30 and the barrier layer (MO) 30 is located on the free layer (FL) 32. Next, the wafer SM2' is bonded to the wafer SM1. The wafer SM2' and the wafer SM1 may be bonded through a hybrid bonding. The hybrid bonding includes a dielectric-to-dielectric bonding and a metal-to-metal bonding. In this embodiment, the dielectric layer 46 of the wafer SM2' may be bonded to the interlayer dielectric layer 118 of the interconnect structure 130 of the wafer SM1. The electrode layer 42 of the MTJ device 50 of the wafer SM2' may be bonded to the conductive line 122a of the interconnect structure 130 of the wafer SM1. The conductive line 200A of the wafer SM2' may be bonded to the conductive line 122b of the interconnect structure 130 of the wafer SM1. The hybrid bonding may be performed by thermal annealing.

Referring to FIG. 5A and FIG. 5B, the substrate 10 is removed to expose the sacrificial layer 12. The method of removing the substrate 10 may include performing a grinding process to a surface 10S2 of the substrate 10.

Referring to FIG. 5B and FIG. 5C, the sacrificial layer 12 is removed. The method of removing the sacrificial layer 12 may be a polishing process or an etching back process.

Accordingly, the wafer SM2' is bonded to the wafer SM1, and the surface 16S of the dielectric layer 16, the surface 14S of the conductive line 14, and the surface 208AS of the conductive line 208A are exposed. Afterwards, the conductive line 14 may be connected to a bit line BL and the conductive line 208B may be connected to a source line SL through a back-end process, and then the dicing process may be performed for singulation to complete the fabrication of a semiconductor device SM3'.

Referring to FIG. 5C, in semiconductor device SM3', the sizes of the upper portions of the vias 120a, 120b, the contacts 114a, 114b are greater than the sizes of the corresponding lower portions of the vias 120a, 120b, the contacts 114a, 114b. The sizes of the upper portions of the via 20, the via 206A are smaller than the sizes of the corresponding lower portions of the via 20, the via 206A.

Likewise, in an embodiment of the present disclosure, the reference layer (RL) 28 of the reversely disposed MTJ device 50 is located on the barrier layer (MgO) 30, and the barrier layer (MgO) 30 is located on the free layer (FL) 32. The reference layer (RL) 28 is closer to the bit line BL than the free layer (FL) 32, and therefore, this type of reversely arranged MTJ device 50 is called a reversed cell type MTJ device or a reversed MTJ device.

Referring to FIG. 5C and FIG. 6, in an embodiment of the present disclosure, a bit line BL is electrically connected to the electrode layer 22 of the reversed MTJ device 50 through the interconnect layer 15A. The electrode layer 42 of the reversed MTJ device 50 is electrically connected to the source/drain region 106 of the metal oxide semiconductor device T through the interconnect layer 130A of the interconnect structure 130. A source line SL is electrically connected to the source/drain region 108 of the metal oxide semiconductor device T through the interconnect layer 215A of the interconnect structure 215' and the interconnect layer 130B of the interconnect structure 130. The gate conductive layer 104 of the metal oxide semiconductor device T may serve as a word line WL or may be connected to a word line WL.

Referring to FIG. 5C and FIG. 6, since the MTJ device 50 of the semiconductor device SM3' of an embodiment of the present disclosure is a reversed cell type MTJ device, the reference layer (RL) 28 is closer to the bit line BL than the free layer (FL) 32, and therefore, such device exhibits better writing margin and lower power consumption. In addition, in an embodiment of the present disclosure, the reversed MTJ device 50 is connected to the source/drain region 106 of the metal oxide semiconductor device T through a bonding method, without the need of a bridge electrical connection. Accordingly, the fabricating process is simplified, the chip area occupied by a bridge connection is greatly reduced, and the cell size is reduced.

To sum up, the inverted cell type MTJ device of an embodiment of the present disclosure exhibits better writing margin and lower power consumption. Moreover, the inverted cell type MTJ device is electrically connected to the source/drain region of the metal oxide semiconductor device without a bridge electrical connection. Therefore, the fabricating process can be simplified, the chip area occupied by a bridge electrical connection can be greatly reduced, and the cell size can be accordingly reduced.

What is claimed is:

1. A semiconductor device, comprising:
   a substrate;
   a first interconnect structure disposed on the substrate;
   an MTJ device reversely bonded to the first interconnect structure, wherein the MTJ device comprises:
      a first electrode layer bonded to the first interconnect structure;
      a second electrode layer located above the first electrode layer;
      an MTJ stack structure located between the first electrode layer and the second electrode layer, wherein the MTJ stack structure comprises:
         a first barrier layer located between the first electrode layer and the second electrode layer;
         a free layer located between the first barrier layer and the first electrode layer; and
         a reference layer located between the first barrier layer and the second electrode layer; and
   a second interconnect structure electrically connected to the MTJ device, wherein the second interconnect structure comprises:
      a second conductive line located above the MTJ device; and
      a second via located between the second electrode layer and the second conductive line, and electrically connected to the second electrode layer and the second conductive line, wherein a size of an upper portion of the second via is smaller than a size of a lower portion of the second via.

2. The semiconductor device of claim 1, wherein the first interconnect structure comprises:
  a first conductive line bonded to the first electrode layer; and
  a first via located between the first conductive line and the substrate.

3. The semiconductor device of claim 2, wherein a size of an upper portion of the first via is greater than a size of a lower portion of the first via.

4. The semiconductor device of claim 1, wherein the second interconnect structure further comprises:
  a third conductive line located above the first interconnect structure; and
  a third via located between the first conductive line and the third conductive line, and electrically connected to the first conductive line and the third conductive line.

5. The semiconductor device of claim 4, wherein a size of an upper portion of the third via is greater than a size of a lower portion of the third via.

6. The semiconductor device of claim 4, wherein a size of an upper portion of the third via is smaller than a size of a lower portion of the third via.

7. The semiconductor device of claim 2, further comprising:
  a transistor located on the substrate, wherein the transistor comprises a gate structure, a first source/drain region and a second source/drain region, wherein the first source/drain region is electrically connected to the first electrode layer of the MTJ device through the first via and the first conductive line;
  a bit line, connected to the second electrode layer of the MTJ device through the second conductive line and the second via; and
  a source line electrically connected to the second source/drain region of the transistor through the third conductive line and the third via.

8. The semiconductor device of claim 1, wherein the MTJ stack structure further comprises:
  a pinned layer located between the reference layer and the second electrode layer;
  a seed layer located between the pinned layer and the second electrode layer;
  a stop layer located between the first electrode layer and the free layer; and
  a second barrier layer located between the free layer and the stop layer.

9. A method of fabricating a semiconductor device, comprising:
  providing a first wafer, wherein the first wafer comprises a first substrate and a first interconnect structure;
  providing a second wafer, wherein a method of forming the second wafer comprises:
  providing a second substrate;
  forming a sacrificial layer on a first surface of the second substrate;
  forming a second interconnect structure on the sacrificial layer;
  forming an MTJ device on the second interconnect structure;
  forming a protection layer on a surface and a sidewall of the MTJ device;
  forming a dielectric layer on the protection layer;
  planarizing the dielectric layer and the protection layer to expose the MTJ device; and
  turning over the second substrate to expose a second surface of the second substrate;
  performing a bonding process to bond the second wafer to the first wafer;
  removing the second substrate; and
  removing the sacrificial layer to expose the second interconnect structure,
  wherein the MTJ device comprises:
  a first electrode layer;
  a second electrode layer located opposite to the first electrode layer; and
  an MTJ stack structure located between the first electrode layer and the second electrode layer, wherein the MTJ stack structure comprises:
  a first barrier layer located between the first electrode layer and the second electrode layer;
  a free layer located between the first barrier layer and the first electrode layer; and
  a reference layer located between the first barrier layer and the second electrode layer
  wherein the second interconnect structure electrically connected to the MTJ device, the second interconnect structure comprises a second conductive line located under the MTJ device and a second via located between the second electrode layer and the second conductive line and electrically connected to the second electrode layer and the second conductive line,
  wherein a size of a lower portion of the second via is smaller than a size of an upper portion of the second via.

10. The method of claim 9, wherein bonding the second wafer to the first wafer comprises bonding the first electrode layer of the MTJ device to the first interconnect structure.

11. The method of claim 9, further comprising, before performing the bonding process, forming another part of the second interconnect structure in the dielectric layer to electrically connect to the first interconnect structure.

12. The method of claim 9, further comprising, after performing the bonding process, forming another part of the second interconnect structure in the dielectric layer to electrically connect to the first interconnect structure.

13. The method of claim 9, further comprising:
  forming a transistor on the first substrate, wherein the transistor comprises a gate structure, a first source/drain region and a second source/drain region, wherein the first source/drain region is connected to the first electrode layer of the MTJ device through the first interconnect structure.

14. The method of claim 9, further comprising:
  forming a bit line, wherein the bit line is connected to the second electrode layer of the MTJ device through the second interconnect structure.

15. The method of claim 13, further comprising:
  forming a source line, wherein the source line is electrically connected to the second source/drain region of the transistor through the first interconnect structure.

* * * * *